(12) United States Patent
Wang et al.

(10) Patent No.: US 8,947,174 B2
(45) Date of Patent: Feb. 3, 2015

(54) BASE STATION RF DUPLEXER, RF MODULE, AND RF SYSTEM

(71) Applicant: Huawei Technologies Co., Ltd., Shenzhen, Guangdong (CN)

(72) Inventors: Haizhao Wang, Shanghai (CN); Guangfu Si, Shanghai (CN); Naier Meng, Shenzhen (CN); Bo Yang, Shenzhen (CN); Puke Zhou, Shanghai (CN); Shengxiang Guo, Shenzhen (CN); Yi Zhang, Shanghai (CN); Weihua Sun, Shenzhen (CN); Jianjun Zhou, Shanghai (CN); Ke Zhang, Shenzhen (CN); Hao Li, Shanghai (CN); Zhiwei Shang, Shenzhen (CN); Runxiao Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/195,409

(22) Filed: Mar. 3, 2014

(65) Prior Publication Data
US 2014/0176256 A1 Jun. 26, 2014

Related U.S. Application Data

(63) Continuation of application No. 12/704,716, filed on Feb. 12, 2010, now abandoned.

(30) Foreign Application Priority Data

Feb. 13, 2009 (CN) .......................... 2009 1 0105437

(51) Int. Cl.
*H01P 1/213* (2006.01)
*H03H 7/46* (2006.01)
(Continued)

(52) U.S. Cl.
CPC ............. *H03H 7/463* (2013.01); *H01P 1/2138* (2013.01); *H01P 1/2136* (2013.01); *H01P 11/007* (2013.01); *H05K 7/20409* (2013.01); *H01P 1/213* (2013.01)
USPC .......................................... 333/135; 333/132

(58) Field of Classification Search
USPC .......................... 333/135, 134, 132, 137, 126
See application file for complete search history.

(56) References Cited

U.S. PATENT DOCUMENTS

| 4,853,657 A | 8/1989 | Cruchon et al. |
| 5,714,920 A | 2/1998 | Ivanov et al. |

(Continued)

FOREIGN PATENT DOCUMENTS

| CN | 1030162 A | 1/1989 |
| CN | 101095385 A | 12/2007 |

(Continued)

OTHER PUBLICATIONS

Rejection Decision in corresponding Chinese Patent Application No. 200910105437.0 (May 6, 2013).

(Continued)

*Primary Examiner* — Stephen Jones
(74) *Attorney, Agent, or Firm* — Leydig, Voit & Mayer, Ltd.

(57) ABSTRACT

The present disclosure relates to telecommunication, and in particular, to a base station Radio Frequency (RF) duplexer, an RF module, and an RF system. A base station RF apparatus provided herein includes: an enclosure, an intermediate RF processing unit, and a duplexer. The enclosure is located on the duplexer; the intermediate RF processing unit is located inside a cavity enclosed by the enclosure and the duplexer, or on the duplexer; a duplexer cavity and a heat dissipation part exist on the surface of the duplexer; the opening of the duplexer cavity is opposite to or against the enclosure; the heat dissipation part is designed to dissipate heat of the intermediate RF processing unit; and the duplexer is integrally molded. The foregoing technical solution requires no external fasteners, reduces the time of production and assembly. In addition, waterproof design and shielding design are not required, and thus improves the reliability.

5 Claims, 3 Drawing Sheets

(51) Int. Cl.
*H01P 11/00* (2006.01)
*H05K 7/20* (2006.01)

(56) References Cited

U.S. PATENT DOCUMENTS

| | | | |
|---|---|---|---|
| 7,224,242 | B2 | 5/2007 | Taylor |
| 2003/0068985 | A1 | 4/2003 | McDonald et al. |
| 2004/0190253 | A1 | 9/2004 | Prasher et al. |
| 2006/0139878 | A1 | 6/2006 | Widmayer et al. |
| 2007/0296518 | A1 | 12/2007 | Avramis et al. |

FOREIGN PATENT DOCUMENTS

| | | |
|---|---|---|
| CN | 201063353 Y | 5/2008 |
| CN | 201345651 Y | 11/2011 |
| DE | 10132311 A1 | 9/2002 |
| EP | 0295688 A1 | 6/1988 |
| EP | 1544938 A1 | 6/2005 |

OTHER PUBLICATIONS $2^{nd}$ Office Action in corresponding Chinese Patent Application No. 200910105437.0 (Jan. 18, 2013).

Extended European Search Report in corresponding European Patent Application No. 10153435.2 (Apr. 22, 2010).

$1^{st}$ Office Action in corresponding European Patent Application No. 10153435.2 (Sep. 17, 2012).

$1^{st}$ Office Action in corresponding Chinese Patent Application No. 200910105437.0 (Jun. 5, 2012).

BASE STATION RF DUPLEXER, RF MODULE, AND RF SYSTEM

CROSS-REFERENCE TO RELATED APPLICATION

This application is a continuation of U.S. patent application Ser. No. 12/704,716, filed on Feb. 12, 2010. U.S. patent application Ser. No. 12/704,716 claims priority to Chinese Patent Application No. 200910105437.0, filed on Feb. 13, 2009, which is hereby incorporated by reference in its entirety.

FIELD OF THE INVENTION

The present disclosure relates to telecommunication technology, and in particular, to a base station Radio Frequency (RF) duplexer, an RF module, and an RF system.

BACKGROUND OF THE INVENTION

Currently, the intermediate RF transceiver link duplexer and the heat sink in the industry are split. That is, the cavity structure of the duplexer and that of the heat sink are designed and manufactured separately, and then fastened together through screws. This solution increases the assembling time and the difficulties of waterproof and shielding design. FIG. 1 shows an ordinary structure of a duplexer cavity. Different duplexers have different internal chambers due to different working parameters. Therefore, the schematic diagram herein gives only the outer appearance rather than the internal structure.

In one of the split-type technical solution in the prior art, the duplexer is located externally on the heat sink structure of the intermediate RF transceiver link. The duplexer cavity and the heat sink are generated through die casting separately. The duplexer cavity is fastened on the heat dissipation teeth side through screws, thus reducing the effective teeth area of the heat sink and affecting the heat dissipation result of the heat sink to some extent. In order to meet the reliability of the modules and prevent water and electromagnetic leak, waterproof design and shielding design need to be applied to the fastened area.

In the process of developing the present disclosure, the inventor finds at least these defects in the prior art: low reliability of modules in the integrated equipment, and long time of production and assembly.

SUMMARY OF THE INVENTION

The embodiments of the present disclosure provide a base station RF apparatus, a base station RF duplexer, and an RF system to improve the reliability of the modules in the integrated equipment and shorten the time of production and assembly.

The base station RF apparatus includes:
an enclosure, located on a duplexer;
an intermediate RF processing unit, located inside a cavity enclosed by the enclosure and the duplexer and located on the duplexer; and
the duplexer, where: a duplexer cavity and a heat dissipation part exist on the surface of the duplexer, the opening of the duplexer cavity is opposite to or against the enclosure, the heat dissipation part is designed to dissipate heat of the intermediate RF processing unit, and the duplexer is integrally molded.

The base station RF duplexer includes a duplexer cavity and a heat dissipation part on the surface of the duplexer, where:
the duplexer cavity and the heat dissipation part are located on the same surface or different surfaces of the duplexer;
a partition wall and a tuning screw exist inside the duplexer cavity, the partition wall is designed to partition the duplexer cavity into chambers, and the tuning screw is designed to adjust the frequency of the duplexer; and
the duplexer is integrally molded.

The base station RF system includes an antenna, and the base station RF apparatus described above, where:
a signal connection is located between the duplexer and the antenna for exchanging signals; and
a signal connection is located between the duplexer and the RF processing unit for exchanging signals.

In the technical solution under the present disclosure, the duplexer cavity and the heat dissipation part are integrally molded through die casting. Therefore, the duplexer cavity and the heat dissipation part constitute an entirety, and no assembly plane is located between the duplexer cavity and the heat dissipation part, thus avoiding additional fasteners, shortening the time of production and assembly, In addition, additional waterproof design and shielding design are not required, and thus improving the reliability.

BRIEF DESCRIPTION OF THE DRAWINGS

In order to make the technical solution under the present disclosure or the prior art clearer, the accompanying drawings for illustrating the embodiments of the present disclosure or the prior art are outlined below. Evidently, the accompanying drawings are for the exemplary purpose only, and those skilled in the art can derive other drawings from such accompanying drawings without making any creative effort.

DETAILED DESCRIPTION

The technical solution under the present disclosure is expounded below by reference to the accompanying drawings. Evidently, the embodiments provided herein are for the exemplary purpose only, and are not all of the embodiments of the present disclosure. Those skilled in the art can derive other embodiments from the embodiments provided herein without making any creative effort, and all such embodiments are covered in the protection scope of the present disclosure.

Embodiment 1

Figure 1:
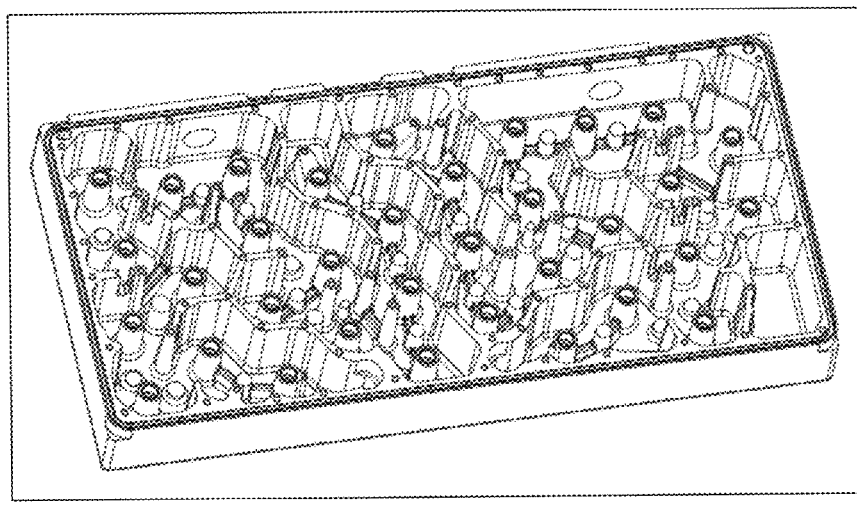
FIG. 1 shows a duplexer cavity structure in the prior art.
Figure 2:
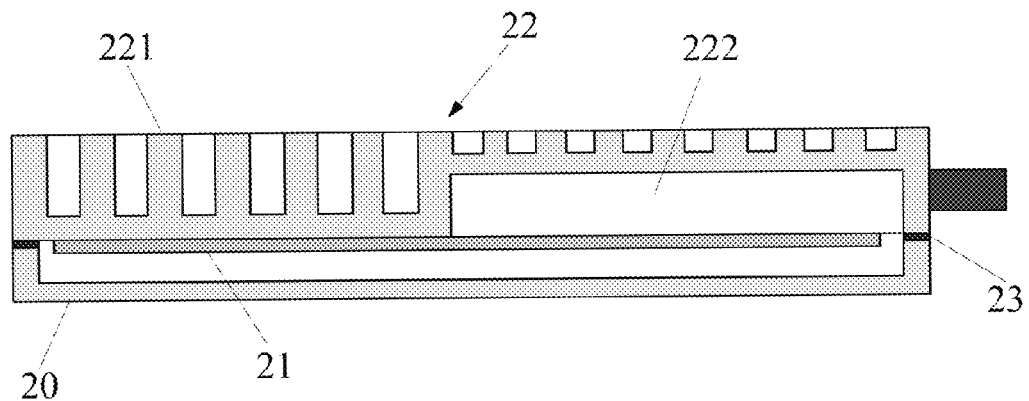
FIG. 2 shows a structure of a base station RF module in the first embodiment of the present disclosure.

As shown in FIG. 2, a base station RF module apparatus provided in this embodiment includes: an enclosure 20, an intermediate RF processing unit 21, and a duplexer 22.

The enclosure 20 is located on the duplexer 22.

The intermediate RF processing unit 21 is located inside the enclosure 20 and located on the duplexer 22.

A duplexer cavity 222 is located on the inner lateral of the duplexer 22, and the duplexer cavity 222 faces toward the inside of the enclosure 20, namely, the opening of the duplexer cavity 222 is opposite to the enclosure 20. A heat dissipation part 221 is located on the outer lateral of the duplexer 22, and the heat dissipation part 221 is designed to dissipate heat of the intermediate RF processing unit 21. The duplexer 22 is integrally molded through die casting.

The enclosure 20 or the intermediate RF processing unit 21 may be located on the duplexer 22 in this way: The enclosure 20 and the intermediate RF processing unit 21 are fitted together through mechanical connection such as screws and fasteners, or through adhesive such as heat-conductive adhesive and sticky heat-conductive material. The heat dissipation part 221 may be implemented in multiple different modes, for example, cooling fins, or liquid cooling pipes. The accompanying drawing for this embodiment takes the cooling fin as an example. However, the present disclosure is not limited to such an implementation mode of the heat dissipation part. All the implementation modes of the heat dissipation part that can be derived by those skilled in the art are covered in the protection scope of the present disclosure.

A partition wall is located inside the duplexer cavity 222. The partition wall divides the duplexer cavity 222 into a plurality of chambers. Due to different working parameters, the modality of the chambers inside the duplexer cavity 222 may differ sharply. The embodiments of the present disclosure do not restrict the modes of the partition wall and the chambers inside the duplexer cavity 222. Those skilled in the art can located the partition wall and the chambers at their discretion according to the application environment.

Figure 3:
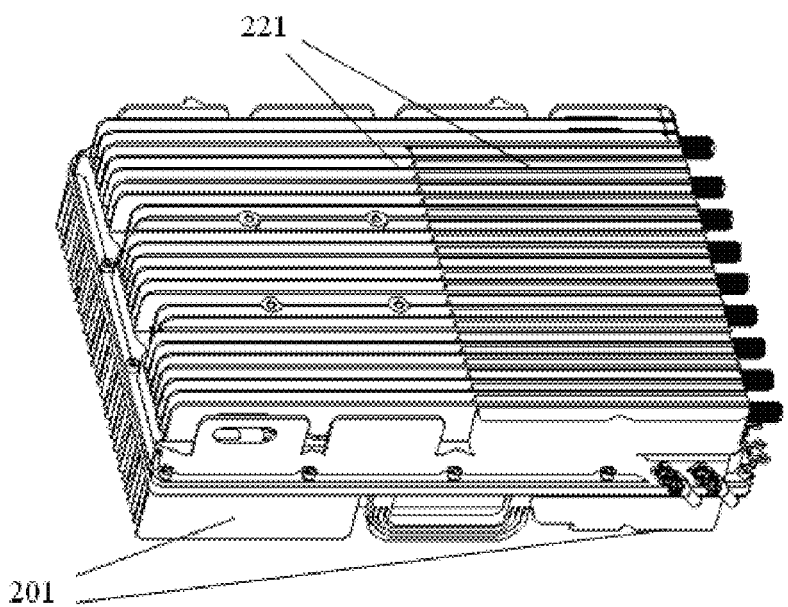
FIG. 3 is a 3-dimensional diagram of a base station RF module in the first embodiment of the present disclosure.

A heat dissipation part 221 is located on the outer lateral of the duplexer 22. Specifically, a heat dissipation part 221 is located on the outer lateral of the duplexer 22 except the rear area of the duplexer cavity 222; or, as shown in FIG. 3, a heat dissipation part 221 is located on the outer lateral of the duplexer 22, including the rear area of the duplexer cavity 222, and the heat dissipation part 221 on the rear area of the duplexer cavity 222 may be linked with or partitioned from the heat dissipation part 221 outside the rear area of the duplexer cavity 222. The heat dissipation part 221 on the rear area may be flush with the heat dissipation part 221 outside the rear area. The heat dissipation part 221 which exists on the outer lateral of the duplexer 22 may be located on only part of the outer lateral. For example, the heat dissipation part 221 may cover part or all of the area except the rear area of the duplexer cavity 222.

Optionally, a heat dissipation part 201 may be located on the outer lateral of the enclosure 20. As shown in FIG. 3, the heat dissipation part 201 improves the heat dissipation efficiency of the intermediate RF processing unit 21. The heat dissipation part 201 is a third heat dissipation part designed on the outer lateral of the enclosure. Further, a waterproof or shielding treatment device 23 may be located between the enclosure 20 and the duplexer 22, as shown in FIG. 2.

In the base station RF module apparatus provided in this embodiment, the duplexer cavity and the heat sink structure are integrally molded through die casting. Therefore, the duplexer cavity and the heat sink structure constitute an entirety, and no assembly plane is located between the duplexer cavity and the heat sink structure, thus avoiding additional fasteners, shortening the time of production and assembly. In addition, the additional waterproof design and shielding design are not required, and thus improving the reliability of the base station RF module. Because the duplexer is outside the enclosure, it does not occupy any internal space of the enclosure. Heat dissipation teeth of a certain height may be reserved on the rear area of the duplexer cavity as required, thus exerting the heat dissipation function to the utmost and improving the heat dissipation capability of the base station RF module.

Embodiment 2

Figure 4:
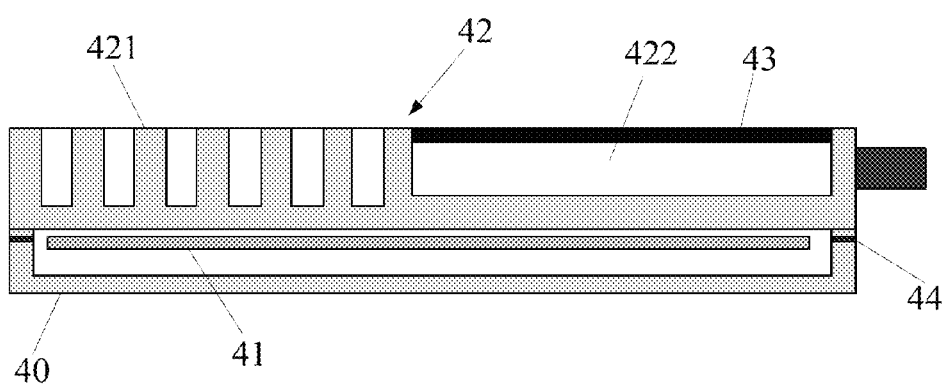
FIG. 4 shows a structure of a base station RF module in the second embodiment of the present disclosure.

As shown in FIG. 4, a base station RF module apparatus provided in this embodiment includes: an enclosure 40, an intermediate RF processing unit 41, a duplexer 42, and a cover plate 43.

The enclosure 40 is located on the duplexer 42.

The intermediate RF processing unit 41 is located inside the enclosure 40 and located on the duplexer 42.

A duplexer cavity 422 is located on the outer lateral of the duplexer 42, and the duplexer cavity 422 faces toward the outside of the enclosure 40, namely, the opening of the duplexer cavity 422 is back against the enclosure 40. A heat dissipation part 421 is located on the outer lateral of the duplexer 42, and the heat dissipation part 421 is designed to dissipate heat of the intermediate RF processing unit 41. The duplexer 42 is integrally molded through die casting.

The cover plate 43 is designed to cover the duplexer cavity 422 and protect the tuning screw in the duplexer cavity 422. The tuning screw is fastened into the screw hole inside the duplexer cavity 422.

The enclosure 40 or the intermediate RF processing unit 41 is located on the duplexer 42 in this way: They are fitted together through mechanical connection such as screws and fasteners, or through adhesive such as heat-conductive adhesive and sticky heat-conductive material. The heat dissipation part 421 may be implemented in multiple different modes, for example, cooling fins, or liquid cooling pipes. The accompanying drawing for this embodiment takes the cooling fin as an example. However, the present disclosure is not limited to such an implementation mode of the heat dissipation part. All the implementation modes of the heat dissipation part that can be derived by those skilled in the art are covered in the protection scope of the present disclosure.

A partition wall is located inside the duplexer cavity 422. The partition wall divides the duplexer cavity 422 into chambers. Due to different working parameters, the modality of the chambers inside the duplexer cavity 422 may differ sharply. The embodiments of the present disclosure do not restrict the modes of the partition wall and the chambers inside the duplexer cavity 422. Those skilled in the art can located the partition wall and the chambers at their discretion according to the application environment.

Figure 5:
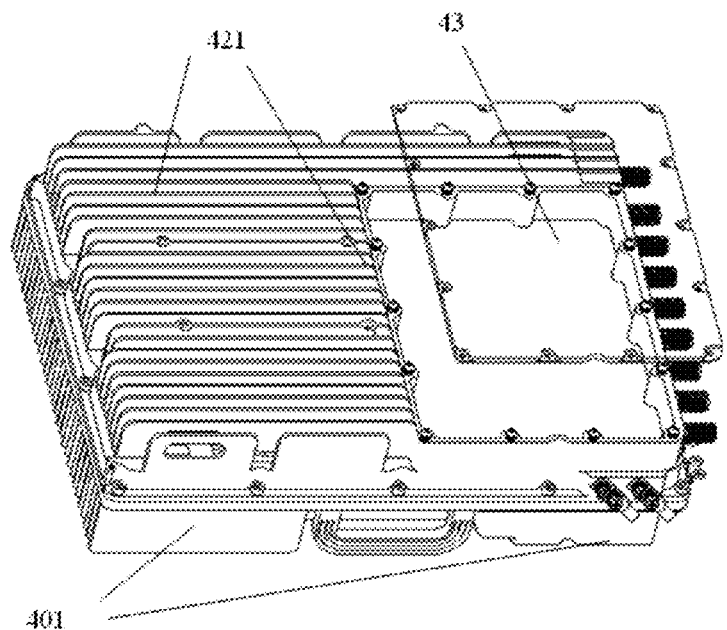
FIG. 5 is a 3-dimensional diagram of a base station RF module in the second embodiment of the present disclosure.

A heat dissipation part 421 is located on the outer lateral of the duplexer 42. The heat dissipation part 421 may be the part except the area of the duplexer cavity 422, as shown in FIG. 5. The heat dissipation part 421 which exists on the outer lateral of the duplexer 42 may be located on only part of the outer lateral. For example, the heat dissipation part 421 may cover part or all of the area except the area of the duplexer cavity 422.

Optionally, a heat dissipation part 401 may be located on the outer lateral of the enclosure 40. As shown in FIG. 5, the heat dissipation part 401 improves the heat dissipation efficiency of the intermediate RF processing unit 41. Further, a waterproof or shielding treatment device 44 may exist between the enclosure 40 and the duplexer 42, as shown in FIG. 4.

The cover plate 43 prevents the tuning screw in the duplexer cavity 422 from colliding with the outside. When other protective measures are available, the cover plate 43 is not necessary. After the cover plate 43 is located, it protects the tuning screw in the duplexer cavity, and ensures stability of the performance parameters of the duplexer.

In the base station RF module apparatus provided in this embodiment, the duplexer cavity and the heat sink structure are integrally molded through die casting. Therefore, the duplexer cavity and the heat sink structure constitute an entirety, and no assembly plane is located between the duplexer cavity and the heat sink structure, thus avoiding additional fasteners, shortening the time of production and assembly. In addition, the additional waterproof design and shielding design are not required, and thus improving the reliability of the base station RF module. Because the duplexer is outside the enclosure, it does not occupy any internal space of the enclosure. A cover plate with waterproof treatment may be added to prevent the tuning screw in the duplexer cavity from colliding with the outside and ensure stability of the performance parameters of the duplexer.

Embodiment 3

Figure 6A:
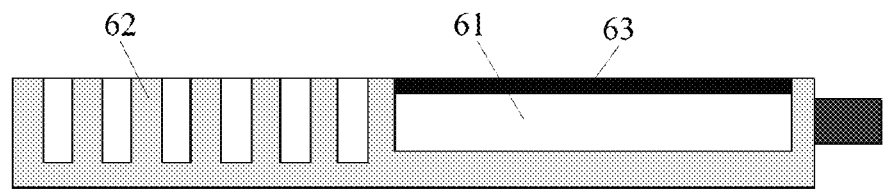
FIG. 6a shows a structure of a base station RF duplexer in the third embodiment of the present disclosure.
Figure 6B:
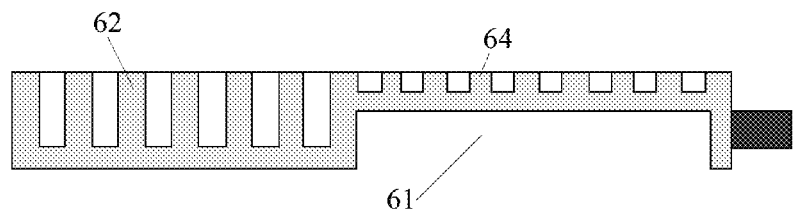
FIG. 6b shows another structure of a base station RF duplexer in the third embodiment of the present disclosure.

As shown in FIG. 6a and FIG. 6b, this embodiment provides an integrative base station RF duplexer. The base station RF duplexer includes a first heat dissipation part formed in one surface of the duplexer, a duplexer cavity formed on the same surface or different surface of the duplexer, wherein the duplexer cavity and the first heat dissipation part are integrally molded. In this embodiment, a duplexer cavity 61 and a heat dissipation part 62 exist on the surface of the duplexer.

A partition wall and a tuning screw exist inside the duplexer cavity 61, the partition wall is designed to partition the duplexer cavity 61 into chambers, and the tuning screw is designed to adjust the frequency of the duplexer.

The heat dissipation part 62 is designed to dissipate heat of the intermediate RF processing unit.

The duplexer cavity 61 and the heat dissipation part 62 are located on the same surface (as shown in FIG. 6a) or on different surfaces (as shown in FIG. 6b) of the duplexer. The duplexer is integrally molded through die casting.

Optionally, as shown in FIG. 6a, when the duplexer cavity 61 and the heat dissipation part 62 are located on the same surface, the duplexer may further include a cover plate 63, which is designed to cover the duplexer cavity 61 and protect the tuning screw in the duplexer cavity 61. The tuning screw is fastened into the screw hole in the duplexer cavity 61. The heat dissipation part 62 is the first heat dissipation part formed in one surface of the duplexer.

Optionally, as shown in FIG. 6b, when the duplexer cavity 61 and the heat dissipation part 62 are located on the different surfaces, a heat dissipation part 64 may be located on the duplexer surface in the rear area of the duplexer cavity 61. The heat dissipation part 64 on the rear area of the duplexer cavity 61 may be linked with or partitioned from the heat dissipation part 62. The heat dissipation part 64 on the rear area may be flush with the heat dissipation part 62. The heat dissipation part 64 is the second heat dissipation part formed at the rear area of the duplexer cavity in the surface which first heat dissipation part located on.

The heat dissipation part 62 may be implemented in multiple different modes, for example, cooling fins and liquid cooling pipes. The accompanying drawing for this embodiment takes the cooling fin as an example. The present disclosure is not limited to such an implementation mode of the heat dissipation part. All the implementation modes of the heat dissipation part that can be derived by those skilled in the art are covered in the protection scope of the present disclosure.

In the base station RF duplexer provided in this embodiment, the duplexer cavity and the heat dissipation part are integrally molded through die casting. Therefore, the duplexer cavity and the heat dissipation part constitute an entirety, and no assembly plane is located between the duplexer cavity and the heat dissipation part, thus avoiding additional fasteners, shortening the time of production and assembly. In addition, the additional waterproof design and shielding design are not required, and thus improving the reliability. A heat dissipation part of a certain height may be reserved on the rear area of the duplexer cavity as required, thus exerting the heat dissipation function to the utmost and improving the heat dissipation capability. Alternatively, a cover plate with waterproof treatment may be added to prevent the tuning screw in the duplexer cavity from colliding with the outside and ensure stability of the performance parameters of the duplexer.

Embodiment 4

Figure 7:
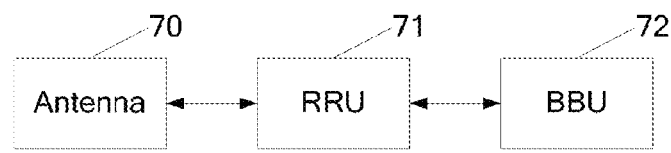
FIG. 7 shows a structure of a base station RF system in the fourth embodiment of the present disclosure.

As shown in FIG. 7, this embodiment provides a base station RF system, which includes an antenna 70 and a Remote Radio Unit (RRU) 71.

The RRU 71 includes an intermediate RF processing unit and a duplexer unit.

The antenna 70 is configured to interconnect with the duplexer unit to exchange signals. The antenna 70 is configured to transmit the received signals to the duplexer unit, and the duplexer unit processes the signals and then transmits the processed signals to the intermediate RF processing unit. The duplexer unit receives the signals from the intermediate RF processing unit, processes the signals and sends the signals to the antenna 70.

The intermediate RF processing unit receives signals from the duplexer unit, performs intermediate RF processing, and then sends the processed signals to a Base Band Unit (BBU) 72. The intermediate RF processing unit receives the signals from the BBU, performs intermediate RF processing, and then sends the processed signals to the duplexer unit.

The duplexer unit may be the base station RF duplexer described in the foregoing embodiments.

The RRU 71 may be the base station RF module described in the foregoing embodiments.

In the base station RF system provided in this embodiment, the duplexer cavity and the heat dissipation part are integrally molded through die casting. Therefore, the duplexer cavity and the heat dissipation part constitute an entirety, and no assembly plane is located between the duplexer cavity and the heat dissipation part, thus avoiding additional fasteners, shortening the time of production and assembly. In addition, the additional waterproof design and shielding design are not required, and thus improving the reliability.

Although the invention has been described through several preferred embodiments, the invention is not limited to such embodiments. It is apparent that those skilled in the art can make modifications and variations to the invention without departing from the spirit and scope of the invention. The invention is intended to cover the modifications and variations provided that they fall in the scope of protection defined by the following claims or their equivalents.

What is claimed is:

1. A base station Radio Frequency, RF, apparatus, comprising:
an enclosure,
an intermediate RF processing unit, a duplexer, wherein the duplexer comprises a duplexer cavity and a first heat dissipation part, the duplexer cavity and the first heat dissipation part being integrally molded through die casting to form an entirety and the duplexer further comprising a first surface and a second surface opposite to the first surface, and a cover plate, wherein the enclosure is located on the first surface of the duplexer, and the intermediate RF processing unit is located inside the enclosure on the first surface of the duplexer so that the first heat dissipation part can dissipate heat of the intermediate RF processing unit, and the enclosure is assembled on the duplexer to have the intermediate RF processing unit located inside a cavity enclosed by the enclosure and the duplexer, and wherein the cover plate is located on the second surface of the duplexer and covers the duplexer cavity to protect elements in the duplexer cavity.

2. The base station RF apparatus of claim 1, wherein a further heat dissipation part is designed on an outer surface of the enclosure.

3. The base station RF apparatus of claim 1, wherein a waterproof or shielding treatment device is located between the enclosure and the duplexer.

4. The base station RF apparatus of claim 1, wherein a plurality of partition walls are defined to partition the duplexer cavity into a plurality of chambers.

5. The base station RF apparatus of claim 4, wherein the elements in the duplexer cavity comprise a plurality of tuning screws, the plurality of tuning screws are located inside the plurality of chambers to adjust the frequency of the duplexer.

* * * * *